United States Patent
Drinovsky et al.

(10) Patent No.: US 11,719,769 B1
(45) Date of Patent: Aug. 8, 2023

(54) METHOD AND APPARATUS FOR SENSOR SIGNAL PATH DIAGNOSTICS

(71) Applicant: Allegro MicroSystems, LLC, Manchester, NH (US)

(72) Inventors: Martin Drinovsky, Horomerice (CZ); Matthieu Thomas, Prague (CZ); Petr Bily, Prague (CZ)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/806,759

(22) Filed: Jun. 14, 2022

(51) Int. Cl.
G01R 33/07 (2006.01)
G01R 33/09 (2006.01)

(52) U.S. Cl.
CPC ......... *G01R 33/072* (2013.01); *G01R 33/091* (2013.01)

(58) Field of Classification Search
CPC ............................. G01R 33/072; G01R 33/091
See application file for complete search history.

(56) References Cited

U.S. PATENT DOCUMENTS

| | | |
|---|---|---|
| 5,592,058 A | 1/1997 | Archer et al. |
| 6,373,307 B1 | 4/2002 | Takai |
| 7,772,838 B2 | 8/2010 | Bailey et al. |
| 8,280,568 B2 | 10/2012 | Nakatsu et al. |
| 8,917,043 B2 | 12/2014 | Reynolds et al. |
| 8,917,044 B2 | 12/2014 | Reynolds et al. |

(Continued)

FOREIGN PATENT DOCUMENTS

| | | |
|---|---|---|
| CN | 105634361 A | 6/2016 |
| EP | 0 848 489 A2 | 6/1998 |

(Continued)

OTHER PUBLICATIONS

U.S. Appl. No. 17/647,639, filed Jan. 11, 2022, Rubinsztain, et al.

(Continued)

*Primary Examiner* — Alvaro E Fortich
(74) *Attorney, Agent, or Firm* — Daly, Crowley, Mofford & Durkee, LLP

(57) ABSTRACT

A sensor includes a first sensing element configured to sense a parameter and generate a first sensing element output signal indicative of the parameter, a first front end element configured to receive the first sensing element output signal and to generate a first front end signal, a second sensing element configured to sense the parameter and generate a second sensing element output signal indicative of the parameter, a second front end element configured to receive the second sensing element output signal and to generate a second front end signal, a difference block configured to receive the first and second front end signals and generate a difference signal indicative of a difference between the first and second front end signals, an absolute value block configured to receive the difference signal and generate an absolute difference signal indicative of an absolute value of the difference signal, and an offset comparator configured to compare the absolute difference signal to an offset threshold to detect whether a difference between an offset associated with the first front end signal and an offset associated with the second front end signal is within a predetermined tolerance.

21 Claims, 6 Drawing Sheets

(56) References Cited

U.S. PATENT DOCUMENTS

| | | |
|---|---|---|
| 9,194,884 B1 | 11/2015 | Mossman et al. |
| 9,329,057 B2 | 5/2016 | Foletto et al. |
| 9,411,023 B2 | 8/2016 | Friedrich et al. |
| 9,780,706 B2 | 10/2017 | Allegrini et al. |
| 9,817,078 B2 | 11/2017 | Pepka et al. |
| 10,380,879 B2 | 8/2019 | Haas et al. |
| 10,580,289 B2 | 3/2020 | Haas et al. |
| 10,636,285 B2 | 4/2020 | Haas et al. |
| 10,725,100 B2 | 7/2020 | Milano et al. |
| 11,163,021 B2 | 11/2021 | Friedrich et al. |
| 11,303,257 B2 | 4/2022 | Daubert et al. |
| 2003/0001537 A1 | 1/2003 | Yang et al. |
| 2003/0070126 A1 | 4/2003 | Werner et al. |
| 2003/0127289 A1 | 7/2003 | Elgas et al. |
| 2005/0007044 A1 | 1/2005 | Qiu et al. |
| 2006/0195720 A1 | 8/2006 | Watts |
| 2007/0001629 A1 | 1/2007 | McGarry et al. |
| 2011/0062909 A1 | 3/2011 | Patel et al. |
| 2012/0074972 A1 | 3/2012 | Rasbornig et al. |
| 2012/0211299 A1 | 8/2012 | Yanai |
| 2013/0106340 A1 | 5/2013 | Chabaud et al. |
| 2013/0200909 A1 | 8/2013 | Rasbornig et al. |
| 2013/0249544 A1 | 9/2013 | Vig et al. |
| 2014/0028237 A1 | 1/2014 | Park et al. |
| 2014/0184200 A1 | 7/2014 | Milano et al. |
| 2014/0285124 A1 | 9/2014 | Derammelaere et al. |
| 2014/0333241 A1 | 11/2014 | Zhao et al. |
| 2015/0015241 A1 | 1/2015 | Tamura |
| 2015/0185279 A1 | 7/2015 | Milano et al. |
| 2015/0185284 A1 | 7/2015 | Milano et al. |
| 2015/0185293 A1 | 7/2015 | Milano et al. |
| 2015/0241523 A1 | 8/2015 | Scherr |
| 2015/0354985 A1 | 12/2015 | Judkins, III et al. |
| 2016/0025820 A1 | 1/2016 | Scheller et al. |
| 2016/0139199 A1 | 5/2016 | Petrie et al. |
| 2016/0139229 A1 | 5/2016 | Petrie et al. |
| 2017/0110652 A1 | 4/2017 | Doogue et al. |
| 2017/0261567 A1* | 9/2017 | Cesaretti ............... H10N 59/00 |
| 2017/0346420 A1 | 11/2017 | Ross et al. |
| 2018/0011140 A1* | 1/2018 | Chaware ............ G01R 31/2884 |
| 2018/0278185 A1* | 9/2018 | Lu ............................. H02P 6/16 |
| 2018/0367073 A1 | 12/2018 | Haas |
| 2019/0079146 A1* | 3/2019 | Romero ................. H10N 52/80 |
| 2019/0235032 A1* | 8/2019 | Lassalle-Balier .... G01R 33/093 |

FOREIGN PATENT DOCUMENTS

| | | |
|---|---|---|
| JP | H 03231317 A | 10/1991 |
| JP | 2006/067667 A | 3/2006 |
| JP | 2010/045914 A | 2/2010 |
| KR | 101394556 B1 | 5/2014 |

OTHER PUBLICATIONS

U.S. Appl. No. 17/659,224, filed Apr. 14, 2022, Casu, et al.

Emadi, McMaster University "Advanced Electric Drive Vehicles", 2015, 3 pages.

International Standard ISO 26262-1 "Road Vehicles—Functional Safety—Part 1 Vocabulary", Nov. 15, 2011, 30 pages.

International Standard ISO 26262-5 "Road Vehicles—Functional Safety—Part 5 Product development at the hardware level", Nov. 15, 2011, 86 pages.

International Standard ISO 26262-9 "Road Vehicles—Functional Safety—Part 9 Automotive Safety Integrity Level (ASIL)—oriented and safety-oriented analyses", Nov. 15, 2011, 24 pages.

Microchip WebSeminars "Sensorless Field Oriented Control (FOC) for Permanent Magnet Synchronous Motors (PMSM)", 51 pages.

Restriction Requirement dated Apr. 6, 2018 for U.S. Appl. No. 15/622,459, 5 pages.

Response to Restriction Requirement and Preliminary Amendment filed Jun. 1, 2018 for U.S. Appl. No. 15/622,459, 10 pages.

Office Action dated Sep. 17, 2018 for U.S. Appl. No. 15/622,459, 11 pages.

Response to Office Action filed Dec. 10, 2018 for U.S. Appl. No. 15/622,459, 14 pages.

Notice of Allowance dated Mar. 18, 2019 for U.S. Appl. No. 15/622,459; 10 pages.

Extended European Search Report dated Oct. 4, 2018 for European Application No. 18176741.9; 7 Pages.

Response to Office Action filed Jun. 27, 2019 for European Application No. 18176741.9; 68 pages.

Office Action dated Mar. 8, 2019 for U.S. Appl. No. 15/697,846; 19 Pages.

Response to Office Action dated Mar. 8, 2019, filed on Jun. 7, 2019 for U.S. Appl. No. 15/697,846; 13 Pages.

Final Office Action dated Jun. 27, 2019, for U.S. Appl. No. 15/697,846; 18 pages.

Response to Final Office Action and Request for Continued Examination filed Sep. 6, 2019, for U.S. Appl. No. 15/697,846; 17 pages.

Office Action dated Oct. 2, 2019 for U.S. Appl. No. 15/697,846; 20 Pages.

Response to Office Action dated Oct. 2, 2019, filed on Jan. 27, 2020 for U.S. Appl. No. 15/697,846; 14 Pages.

Extended European Search Report dated Jan. 23, 2019 for European Application No. 18192781.5; 8 Pages.

Response to Office Action filed Sep. 13, 2019 for European Application No. 18192781.5; 18 pages.

Office Action dated Oct. 10, 2019 for U.S. Appl. No. 16/444,347; 6 pages.

Response to Office Action dated Oct. 10, 2019, files on Dec. 11, 2019, for U.S. Appl. No. 16/444,347; 10 pages.

Notice of Allowance dated Jan. 13, 2020 for U.S. Appl. No. 16/444,347; 8 pages.

Allegro MicroSystems Datasheet "ACS37601 Asil C, Very High Precision, Programmable Linear Hall-Effect Sensor IC with High-Bandwidth (240 kHz) Analog Output for Core-Based Current Sensing", Sep. 9, 2021, 29 pages.

* cited by examiner

METHOD AND APPARATUS FOR SENSOR SIGNAL PATH DIAGNOSTICS

FIELD

This disclosure relates generally to sensors and, more particularly to sensor signal path diagnostics.

BACKGROUND

As is known, sensors are used to perform various functions in a variety of applications. Some sensors include one or more magnetic field sensing elements, such as a Hall effect element or a magnetoresistive element, to detect aspects of movement of a ferromagnetic article, or target, such as proximity, speed, and direction. Applications using these sensors include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, a current sensor that senses a magnetic field generated by a current flowing in a current conductor, and an angle sensor that senses an angle of a magnetic field. Magnetic field sensors are widely used in automobile control systems, for example, to detect ignition timing from a position of an engine crankshaft and/or camshaft, and to detect a position and/or rotation of an automobile wheel for anti-lock braking systems.

Sensors are often provided in the form of integrated circuits (ICs) containing one or more semiconductor die supporting sensing elements, electronic circuitry and optionally containing additional elements, such as a magnet and/or passive components, such as capacitors. Sensor integrated circuits are widely used in automobile control systems and other safety critical applications. There are a variety of specifications that set forth requirements related to permissible sensor quality levels, failure rates, and overall functional safety. For example, some automotive applications require conformity to Automotive Safety Integrity Level (ASIL) standards. One approach to meeting such mandates has been to use redundant, identical circuits in a sensor integrated circuit. Another approach is to test parts during and after the manufacturing process. For example, some parts include self-test capabilities, i.e., internal circuitry that can be used by the part to test itself. These self-tests may include built-in self-tests (i.e., "BIST" tests) and can be used to test various aspect of the sensor circuitry.

SUMMARY

Described herein are sensors that include redundant signal paths, or processing channels for safety purposes and diagnostics for assessing the operation of the channels in order to identify errors. The diagnostics can assess whether one or more characteristics (e.g., offset and/or gain) associated with each of the channels are within a predetermined tolerance of each other. For example, if an offset associated with one of the channels differs by more than a first predetermined amount from an offset associated with the other channel, then an error can be indicated. Alternatively or additionally, if a gain associated with one channel differs by more than a second predetermined amount from a gain associated with the other channel, then an error can be indicated. Detection of an error can be communicated to circuits and systems internal or external with respect to the sensor for further action, such as placing the sensor in a safe state.

According to the disclosure, in an aspect, a sensor includes a first sensing element configured to sense a parameter and generate a first sensing element output signal indicative of the parameter, a first front end element configured to receive the first sensing element output signal and to generate a first front end signal, a second sensing element configured to sense the parameter and generate a second sensing element output signal indicative of the parameter, a second front end element configured to receive the second sensing element output signal and to generate a second front end signal, a difference block configured to receive the first and second front end signals and generate a difference signal indicative of a difference between the first and second front end signals, an absolute value block configured to receive the difference signal and generate an absolute difference signal indicative of an absolute value of the difference signal, and an offset comparator configured to compare the absolute difference signal to an offset threshold to detect whether a difference between an offset associated with the first front end signal and an offset associated with the second front end signal is within a predetermined tolerance.

Features may include one or more of the following individually or in combination with other features.

In some implementations, the sensor includes a scaling block configured to receive the first and second front end signals and generate a scaled average signal indicative of an average of the first and second front end signals scaled by a gain threshold, a second absolute value block configured to receive the scaled average signal and generate an absolute scaled average signal indicative of an absolute value of the scaled average signal, and a gain comparator configured to compare the absolute scaled average signal to the absolute difference signal to detect whether a difference between a gain associated with the first front end signal and a gain associated with the second front end signal is within a second predetermined tolerance.

In some implementations, the first front end element includes a first amplifier and wherein the second front end element includes a second amplifier.

In some implementations, each of the first sensing element and the second sensing element includes a magnetic field sensing element.

In some implementations, the magnetic field sensing element includes a Hall effect element.

In some implementations, the offset comparator is configured to generate an offset fault signal indicative of whether the difference between the offset associated with the first front end signal and the offset associated with the second front end signal is within the predetermined tolerance.

In some implementations, the gain comparator is configured to generate a gain fault signal indicative of whether the difference between the gain associated with the first front end signal and the gain associated with the second front end signal is within the second predetermined tolerance.

In some implementations, the sensor is configured to identify a system fault based on one or both of the offset fault signal and the gain fault signal.

In some implementations, the sensor is configured to identify a system fault when both the offset fault signal and the gain fault signal indicate respective faults.

In some implementations, the first front end signal and the second front end signal are each differential voltage signals.

In some implementations, the sensor includes an offset threshold generator configured to generate the offset threshold.

In some implementations, the absolute value block includes a cross switch configured to invert a polarity of the difference signal if the difference signal is negative, and the second absolute value block includes a second cross switch configured to invert a polarity of the scaled average signal if the scaled average signal is negative.

In some implementations, the absolute value block includes a comparator configured to identify whether the difference signal is negative, and the second absolute value block includes a second comparator configured to identify whether the scaled average signal is negative.

In some implementations, the difference block includes a passive resistor network.

In some implementations, the difference block includes an operational amplifier.

In some implementations, the gain threshold is determined based at least in part on a configurable resistive value.

In some implementations, the gain threshold has a value less than one.

In another aspect, a sensor includes a first sensing element configured to sense a parameter and generate a first sensing element output signal indicative of the parameter, a first front end element configured to receive the first sensing element output signal and to generate a first front end signal, a second sensing element configured to sense the parameter and generate a second sensing element output signal indicative of the parameter, a second front end element configured to receive the second sensing element output signal and to generate a second front end signal, an offset comparator configured to generate an offset fault signal indicative of whether a difference between an offset associated with the first front end signal and an offset associated with the second front end signal is within a predetermined tolerance, a gain comparator configured to generate a gain fault signal indicative of whether a gain associated with the first front end signal and a gain associated with the second front end signal is within a second predetermined tolerance, and digital circuitry. The digital circuitry is configured to receive the offset fault signal and the gain fault signal, count instances of concurrent faults indicated by the offset fault signal and the gain fault signal, compare a number of counted instances of concurrent faults over a particular time period to a threshold count value, and indicate a system fault if the number of counted instances of concurrent faults over the particular time period satisfies the threshold count value.

Features may include one or more of the following individually or in combination with other features.

In some implementations, the offset comparator is configured to compare an absolute difference signal indicative of an absolute value of a difference between the first front end signal and the second front end signal to an offset threshold.

In some implementations, the gain comparator is configured to compare an absolute scaled average signal indicative of an absolute value of a scaled average signal indicative of an average of the first front end signal and the second front end signal scaled by a gain threshold to the absolute difference signal.

In some implementations, the digital circuitry includes an AND gate configured to receive the offset fault signal and the gain fault signal and provide a count indicator, a counter configured to receive the count indicator and output a cumulative count that corresponds to the number of counted instances of concurrent faults over the particular time period, and a comparator configured to compare the cumulative count to the threshold count value, and output a signal indicative of the system fault if the cumulative count satisfies the threshold count value.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
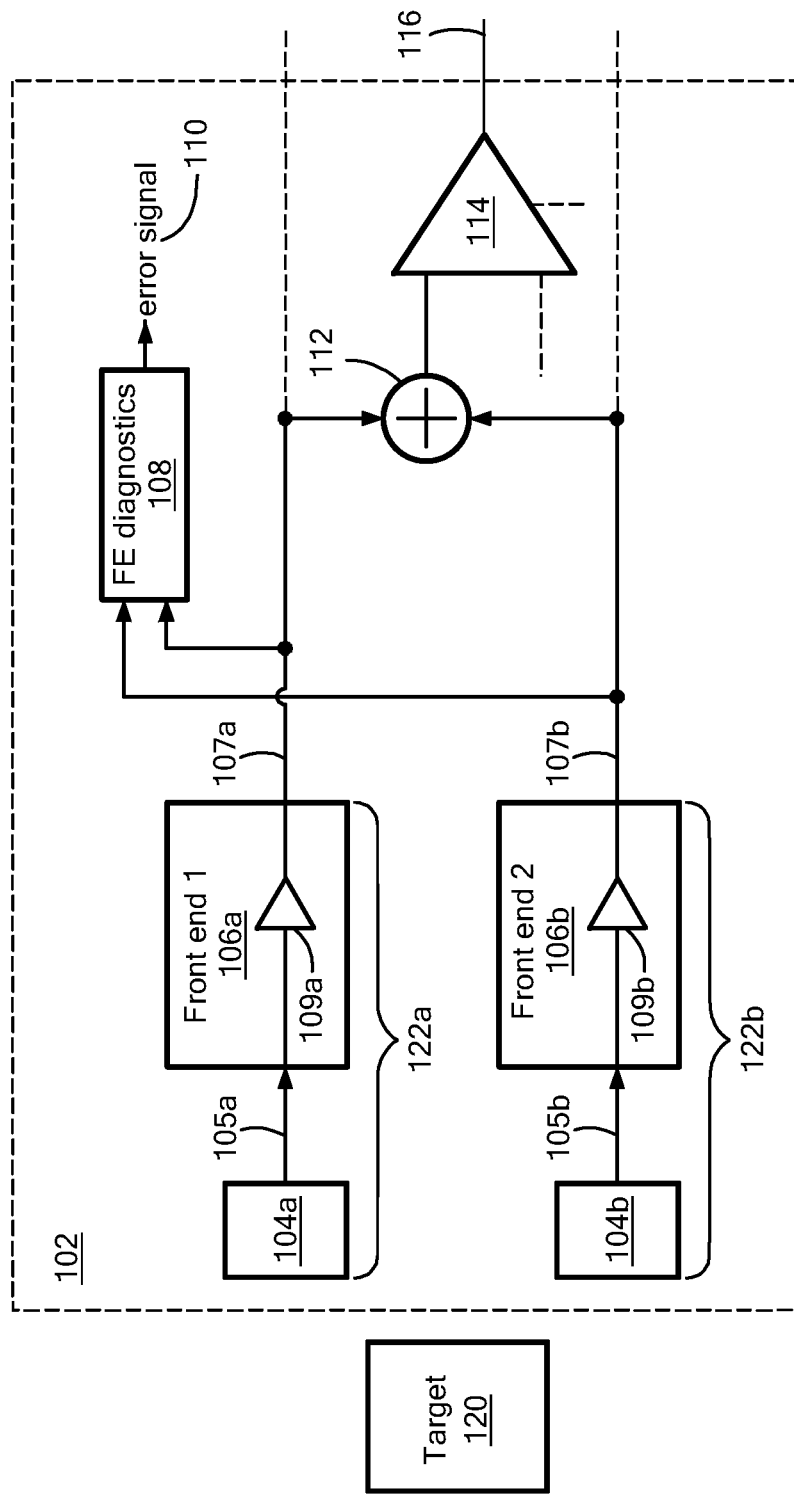
FIG. 1 is a block diagram of a sensor that includes a front end diagnostics block that is configured to provide an error signal.

Referring to FIG. 1, a sensor 102 includes redundant processing channels 122a, 122b as a mechanism to meet safety requirements. Diagnostics can be implemented in order to assess operation of the processing channels 122a, 122b in order to provide an indication (e.g., a fault or error signal 110) to circuits and/or systems (not shown) which can be internal or external with respect to the sensor 102. Such diagnostics can include a front end diagnostics block 108 configured to assess whether one or more characteristics (e.g., offset and/or gain) associated with front end signals 107a, 107b from the redundant processing channels 122a, 122b are within a permissible tolerance of each other.

The sensor 102 includes a first sensing element 104a and a second sensing element 104b. The first sensing element 104a is configured to sense a parameter associated with a target object 120 and generate a first sensing element output signal 105a indicative of the parameter and the second sensing element 104b is configured to sense the parameter and generate a second sensing element output signal 105a indicative of the parameter. The sensor 102 includes a first front end element 106a configured to receive the first sensing element output signal 105a and to generate a first front end signal 107a and a second front end element 106b configured to receive the second sensing element output signal 105b and to generate a second front end signal 107b. The first front end element 106a can include a first amplifier 109a for amplifying the first sensing element output signal 105a and the second front end element 106b can include a second amplifier 109b for amplifying the second sensing element output signal 105b. Example front end processing can include automatic gain control and/or offset adjustment.

Processing elements associated with each sensing element 104a, 104b can form a respective processing channel 122a, 122b. The sensing element output signals 105a, 105b and the front end signals 107a, 107b can be single-ended or differential signals. One or more components of the processing channels 122a, 122b (i.e., the first and second sensing elements 104a, 104b and the first and second front end elements 106a, 106b) may be identical, duplicate components. In this way, redundant sensing of the same parameter using the same sensing methodology can be performed by the sensor 102. In some implementations, the processing channels 122a, 122b may be heterogenous, such that one or more components of the processing channels 122a, 122b are different and/or the sensing methodology performed by the processing channels 122a, 122b is different. The particular safety standard according to which the sensor 102 is to operate may determine the particular characteristics of the processing channels 122a, 122b.

The first front end signal 107a and the second front end signal 107b are provided to a front end diagnostics block 108 of the sensor 102 with which the first and second front end signals 107a, 107b can be compared to each other. Based on the comparison, the front end diagnostics block 108 can provide a fault, or error signal 110. For example, if an offset associated with the first front end signal 107a and an offset associated with the second front end signal 107b deviate by more than an allowed tolerance, and/or if a gain associated with the first front end signal 107a and a gain associated with the second front end signal 107b deviate by more than an allowed tolerance, a fault may exist in the sensor 102, and such may be indicated by the error signal 110. The allowed tolerances can be predetermined tolerances.

The first front end signal 107a and the second front end signal 107b can also be provided to summation circuitry 112. The summation circuitry 112 can sum and average the first and second front end signals 107a, 107b, which summed and averaged signal can be amplified by an amplifier 114 to provide a sensor output signal 116 indicative of the sensed parameter. By summing and averaging the two front end signals 107a, 107b, signal to noise ratio can be improved. In some implementations, the first front end signal 107a and the second front end signal 107b are additionally or alternatively provided as sensor output signals, as illustrated by dotted lines.

In some implementations, the sensor 102 of FIG. 1 can be a magnetic field sensor, and the first and second sensing elements 104a, 104b may each include a magnetic field sensing element. The magnetic field sensing element may be a Hall effect element. As used herein, the term "magnetic field sensor" is used to describe a circuit that uses one or more magnetic field sensing elements, generally in combination with other circuits. The magnetic field sensor can be, for example, a rotation detector, a movement detector, a current sensor, or a proximity detector. A rotation detector can sense rotation of an object, for example, advance and retreat of magnetic domains of a ring magnet or advance and retreat of gear teeth of a ferromagnetic gear. The term "movement detector" can be used to describe either a rotation detector or a magnetic field sensor that can sense different movement, e.g., linear movement, of a ferromagnetic object, for example, linear movement of magnetic domains of a ring magnet or linear movement of gear teeth of a ferromagnetic gear.

In an example implementation, the sensor 102 is a current sensor integrated circuit and the target object 120 is a current conductor as may be integral with or separate from the current sensor 102. The sensing elements 104a, 104b can be magnetic field sensing elements configured to sense a magnetic field generated by a current flow through the conductor.

Magnetic field sensors are used in a variety of applications, including, but not limited to an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field. The circuits and techniques described herein apply to any magnetic field sensor capable of detecting a magnetic field.

As used herein, the term "magnetic field sensing element" is used to describe a variety of electronic elements that can sense a magnetic field. The magnetic field sensing element can be, but is not limited to, a Hall effect element, a magnetoresistance element, an inductive element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Figure 2:
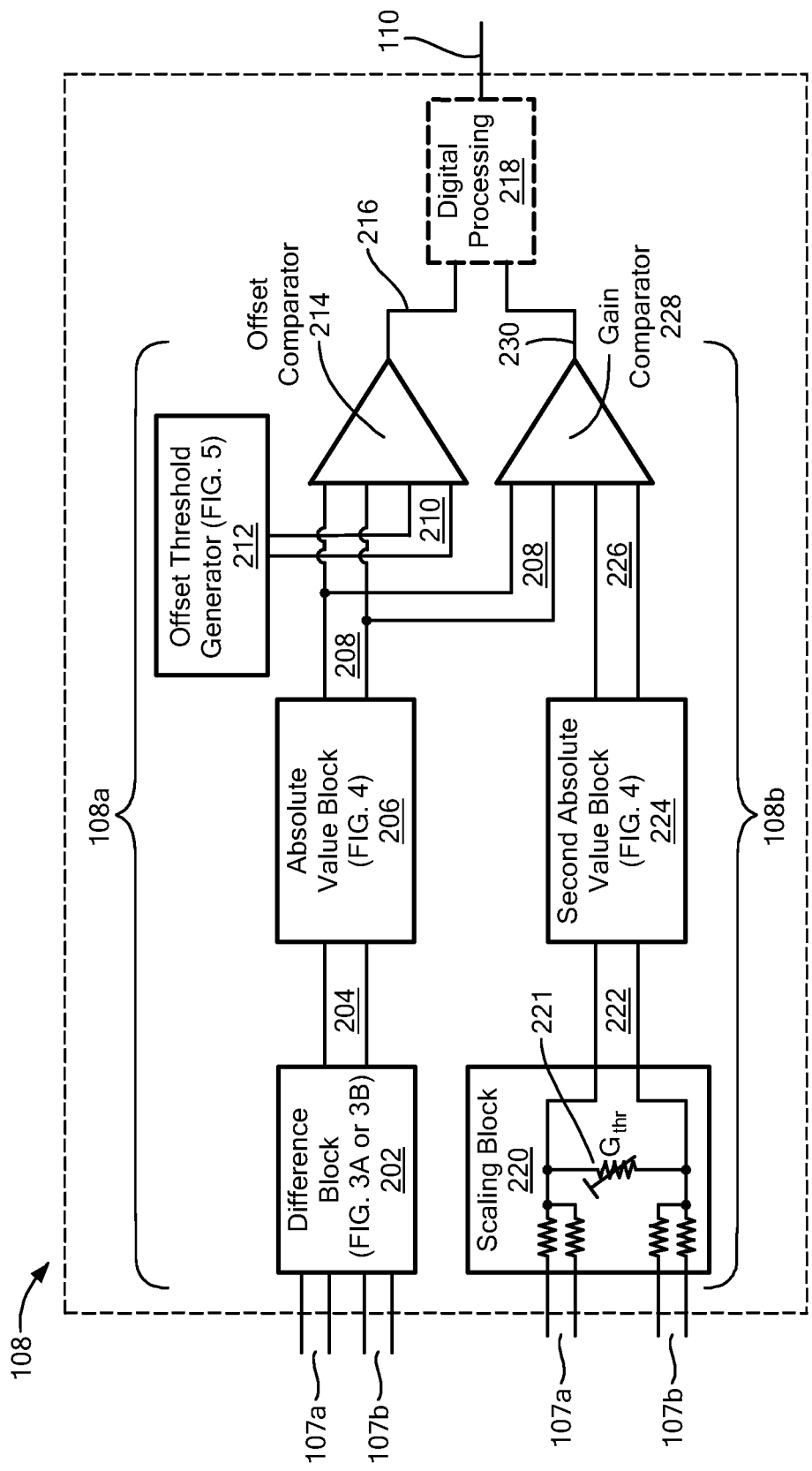
FIG. 2 shows an example front end diagnostics block of FIG. 1.

FIG. 2 shows an example front end diagnostics block 108 of FIG. 1. In general, the front end diagnostics block 108 receives the first front end signal 107a and the second front end signal 107b, performs various operations and comparisons on the front end signals 107a, 107b, and outputs the error signal 110 based on the comparisons. More particularly, such the diagnostics block 108 can include offset diagnostics circuitry 108a for detecting whether an offset associated with the first and second front end signals 107a, 107b is within a permissible tolerance and gain diagnostics circuitry 108b for detecting whether a gain associated with the first and second front end signals 107a, 107b is within a permissible tolerance. In some implementations, the diagnostics block 108 can include only the offset diagnostics circuitry 108a or only the gain diagnostics circuitry 108b. Accordingly, the error signal 110 can indicate whether or not the offset associated with the front end signals 107a, 107b deviates by more than the allowed tolerance and/or whether the gain associated with the front end signals 107a, 107b deviates by more than the allowed tolerance. In this example, the first front end signal 107a and the second front end signal 107b are each differential voltage signals.

Figure 3B:
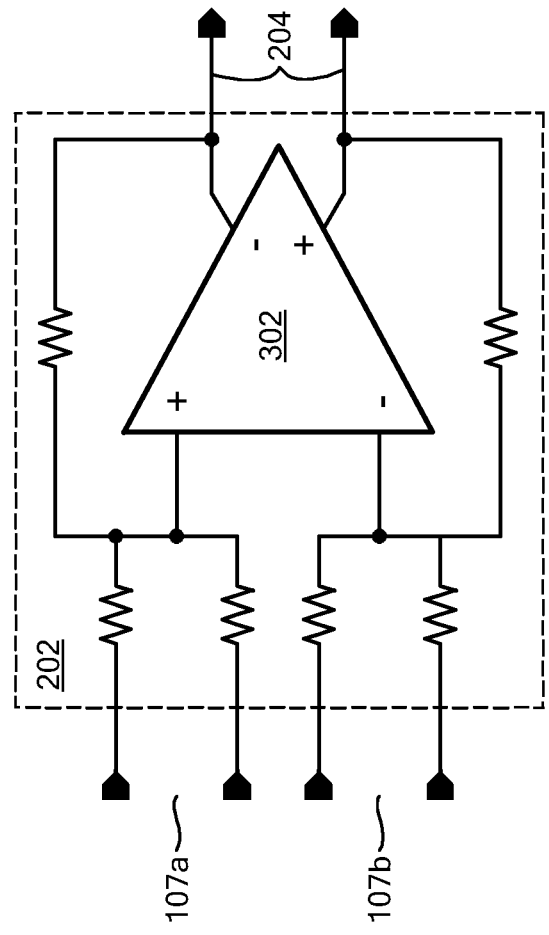
FIGS. 3A and 3B show example difference blocks that can be included in the front end diagnostics block of FIG. 2.
Figure 3A:
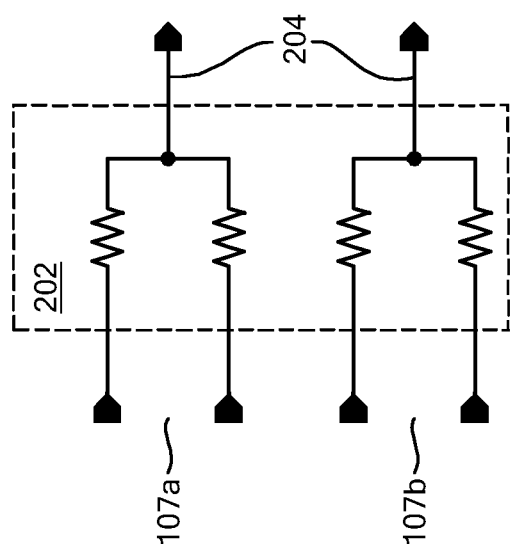
Figure 4:
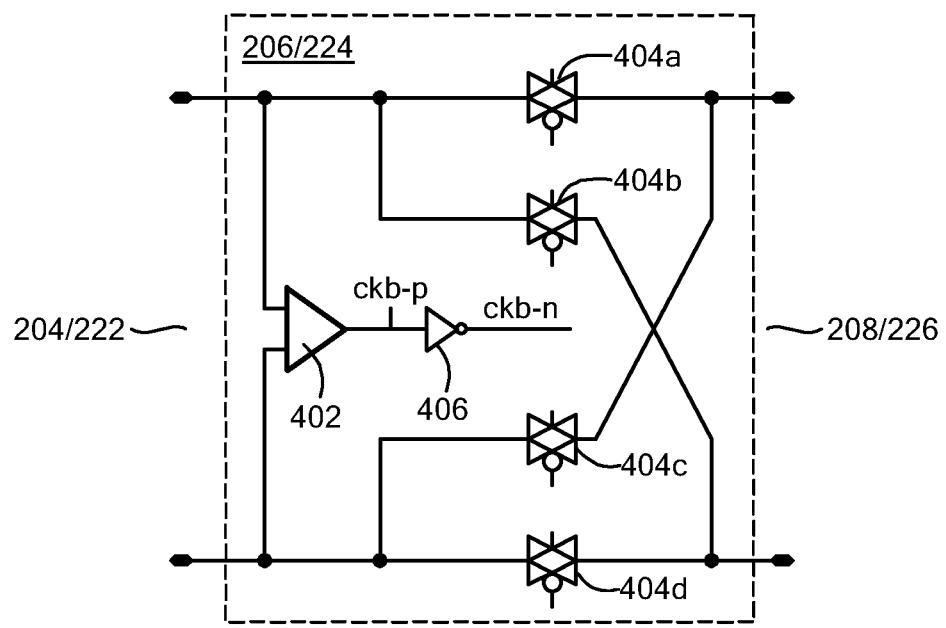
FIG. 4 shows an example absolute value block that can be included in the front end diagnostics block of FIG. 2.
Figure 5:
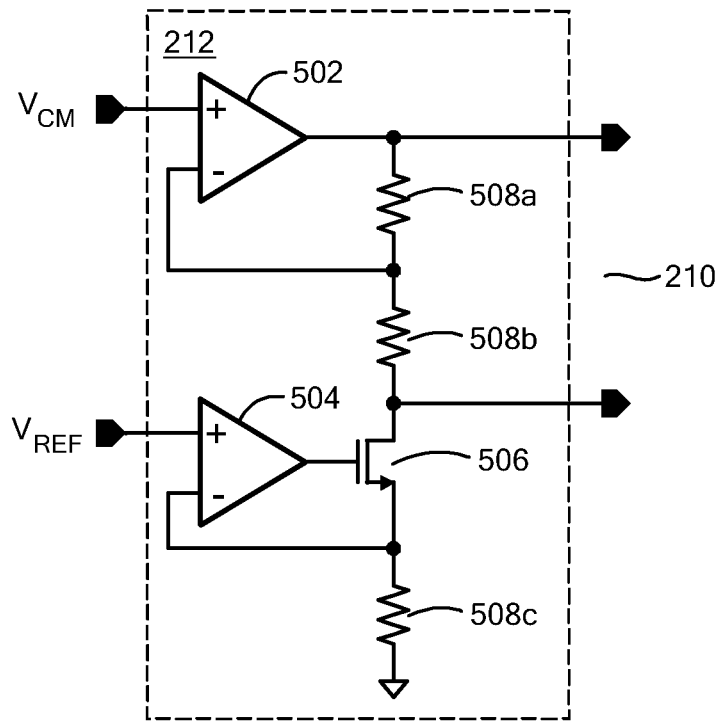
FIG. 5 shows an example offset threshold generator that can be included in the front end diagnostics block of FIG. 2.

The offset diagnostics circuitry 108a can include a difference block 202, an absolute value block 206, an offset comparator 214, and an offset threshold generator 212. An example difference block 202 is shown in FIGS. 3A and 3B, an example absolute value block 206 is shown in FIG. 4, and an example offset threshold generator 212 is shown in FIG. 5.

The first and second front end signals 107a, 107b can be provided to the difference block 202 of the offset diagnostics circuitry 108a. The difference block 202 is configured to generate a difference signal 204 indicative of a difference between the first and second front end signals 107a, 107b. The difference signal 204 is provided to the absolute value block 206, which is configured to generate an absolute difference signal 208 indicative of an absolute value of the difference signal 204. The absolute difference signal 208 is coupled to inputs of the offset comparator 214, which is configured to compare the absolute difference signal 208 to an offset threshold $V_{th}$ 210 generated by the offset threshold generator 212. If the absolute difference signal 208 exceeds the offset threshold $V_{th}$ 210, then the offset comparator 214 outputs an offset fault signal 216 indicating an offset error (e.g., by outputting a logic level value of "1"); whereas if the absolute difference signal 208 is less than the offset threshold $V_{th}$ 210, then the offset comparator 214 outputs an offset fault signal 216 indicating the absence of an offset error (e.g., by outputting a logic level value of "0"). In this way, the offset comparator 214 can detect whether a difference between an offset associated with the first front end signal 107a and an offset associated with the second front end signal 107b is within a predetermined tolerance as established by the offset threshold $V_{th}$ 210. The value of the offset threshold $V_{th}$ 210 can be based on system and/or application requirements and can be user adjusted or programmed in some embodiments. An example implementation of the offset threshold generator 212 is shown in FIG. 5.

The gain diagnostics circuitry 108b can include a scaling block 220, a second absolute value block 224, and a gain comparator 228. The second absolute value block 224 can take the same form as shown in FIG. 4 for the absolute value block 206.

The first and second front end signals 107a, 107b can be provided to the scaling block 220, which is configured to generate a scaled average signal 222 that is indicative of an average of the first and second front end signals 107a, 107b scaled by a gain threshold $G_{th}$. In particular, the scaling block 220 sums and averages the first and second front end signals 107a, 107b and scales the summed average by the gain threshold $G_{th}$. The scaling block 220 may take the form of the illustrated passive resistor divider network and an adjustable resistor 221 can be used to set the gain threshold $G_{th}$. The value of the gain threshold $G_{th}$ can be based on system and/or application requirements and can be user adjusted or programmed in some embodiments. In some implementations, the gain threshold $G_{th}$ has a value less than one, such that the summed average of the first and second front end signals 107a, 107b is scaled down to a lesser value. In some implementations, the configurable resistor 221 is implemented with one or more switches.

The scaled average signal 222 is provided to the second absolute value block 224, which is configured to generate an absolute scaled average signal 226 indicative of an absolute value of the scaled average signal 222. The absolute scaled average signal 226 and the absolute difference signal 208 from the absolute value block 206 are coupled to inputs of the gain comparator 228. The absolute difference signal 208 is also coupled to inputs of the gain comparator 228. The gain comparator 228 is configured to compare the absolute scaled average signal 226 to the absolute difference signal 208. If the absolute difference signal 208 exceeds the absolute scaled average signal 226, then the gain comparator 228 outputs a gain fault signal 230 indicating a gain error (e.g., by outputting a logic level value of "1"); whereas if the absolute difference signal 208 is less than the absolute scaled average signal 226, then the gain comparator 228 outputs a gain fault signal 230 indicating the absence of a gain error (e.g., by outputting a logic level value of "0"). In this way, the gain comparator 228 can detect whether a difference between a gain associated with the first front end signal 107a and a gain associated with the second front end signal 107b is within a second predetermined tolerance.

The offset fault signal 216 and the gain fault signal 230 are provided to a digital processing block 218, which is configured to process the signals 216, 230 and provide the error signal 110. The error signal 110 can be provided at an output of the sensor 102 (FIG. 1) or to another portion of the sensor 102, as described in more detail below. While various block and associated operations are described with respect to FIG. 2, it should be understood that the front end diagnostics block 108 may include fewer than all of the illustrated block without departing from the scope of the inventive concepts described herein. For example, as noted above, in some implementations, the front end diagnostics block 108 may include only the offset diagnostics circuitry 108a or the gain diagnostics circuitry 108b, in which case the front end diagnostics block 108 may be configured to provide the error signal 110 based on only one of the offset fault signal 216 or the gain fault signal 230. Stated differently, it is expected that the difference between the first and second front end signals 107a, 107b is either below the offset threshold $V_{th}$ 210 or below the absolute scaled average signal 226 or both.

FIG. 3A shows an example implementation of the difference block 202 of FIG. 2. In the illustrated example, the difference block 202 is implemented as a passive resistor network that includes a plurality of resistors. The difference block 202 receives the first and second front end signals 107a, 107b and generates the difference signal 204 indicative of the difference between the first and second front end signals 107a, 107b. The difference block 202 implemented as a passive resistor network can require less silicon area as compared to other configurations of the difference block 202.

FIG. 3B shows another example of the difference block 202 of FIG. 2. In the illustrated example, the difference block 202 is implemented with a differential amplifier 302 configuration including input and feedback resistors. The difference block 202 implemented with the differential amplifier 302 can provide improved signal to noise ratio as compared to other configurations of the difference block 202 (e.g., such as the configuration shown in FIG. 3A).

FIG. 4 shows an example absolute value block 206, 224 illustrating how the absolute value block 206 and/or the second absolute value block 224 of FIG. 2 can be implemented. For illustrative purposes and for simplicity, FIG. 4 will be described with respect to the absolute value block 206 of FIG. 2, but it should be understood that the second absolute value block 224 can be implemented in a substantially similar way. In the illustrated example, the absolute value block 206 includes a comparator 402 and a plurality of controllable switches 404a-d arranged as a cross switch. In some implementations, each switch 404a-d can take the form of back to back transistors, with one transistor controlled by a positive control signal (e.g., ckb-p) and the other transistor controlled by an inverted version of the control signal (e.g., ckb-n). The comparator 402 is configured to receive the difference signal 204 from the difference block 202 and identify whether the difference signal 204 is positive or negative. As described above, the difference signal 204 may be a differential voltage signal. If the difference signal 204 is positive, then the comparator output signal ckb-p can be at a first logic level (e.g., a logic level value of "1"); whereas if the difference signal 204 is negative, then the comparator output signal ckb-p can be at a second opposite logic level (e.g., a logic level value of "0"). The comparator output signal ckb-p can be inverted by an inverter 406 to generate an inverted control signal ckb-n, as shown.

The switches 404a-d arranged in the cross switch configuration are configured to receive as control signals either the comparator output signal ckb-p or the inverted version of the control signal ckb-n. If the difference signal 204 is positive, then switches 404a and 404d are closed and switches 404b and 404c are open in order to thereby pass the difference signal 204 to the output of the absolute value block 206 without modification. On the other hand, if the difference signal 204 is negative, then switches 404a and 404d are open and switches 404b and 404c are closed in order to invert the polarity of the difference signal 204. In this way, an absolute value of the difference signal 204 is provided by the absolute value block 206 in the form of the absolute difference signal 208. The second absolute value block 224 can be implemented similarly to provide an absolute value of the scaled average signal 222 in the form of the absolute scaled average signal 226.

FIG. 5 shows an example of the offset threshold generator 212 of FIG. 2. The offset threshold generator 212 is configured to receive a reference voltage $V_{REF}$ and convert the reference voltage $V_{REF}$ to a differential voltage signal that provides the offset threshold $V_{th}$ 210. In the illustrated example, the offset threshold generator 212 includes a first operational amplifier 502 coupled to receive a common mode voltage $V_{CM}$ and a second operational amplifier 504 arranged as a current sink and coupled to receive the reference voltage $V_{REF}$. A current flows through resistors 508a and 508b, and the current has a value of $V_{REF}$ divided by the value of a resistor 508c. The resistor 508c is coupled to the second operational amplifier 504 and a pass element 506 that is controlled by an output of the second operational amplifier 504. The current that flows through resistors 508a and 508b results in a differential voltage being generated in the form of the differential offset threshold $V_{th}$ 210. In particular, the differential offset threshold $V_{th}$ 210 is a scaled version of the reference voltage $V_{REF}$, and has a value that is determined according to $V_{th}=V_{REF}*(508a+508b)/508c$. The resistors 508a and 508b can have the same value such that the first operational amplifier 502 maintains the common mode voltage $V_{CM}$ between the resistors 508a and 508b. In this way, the differential offset threshold $V_{th}$ 210 is symmetrical around the common mode voltage $V_{CM}$. In some implementations, the reference voltage $V_{REF}$ is a single-ended bandgap-based voltage. As described above, selection of the values of resistors 508a-508c can establish the value of the offset threshold $V_{th}$ 210. In some implementations, the offset threshold $V_{th}$ 210 can be user-selectable or programmable, in which case one or more of resistors 508a-508c can be adjustable by user input.

Figure 6:
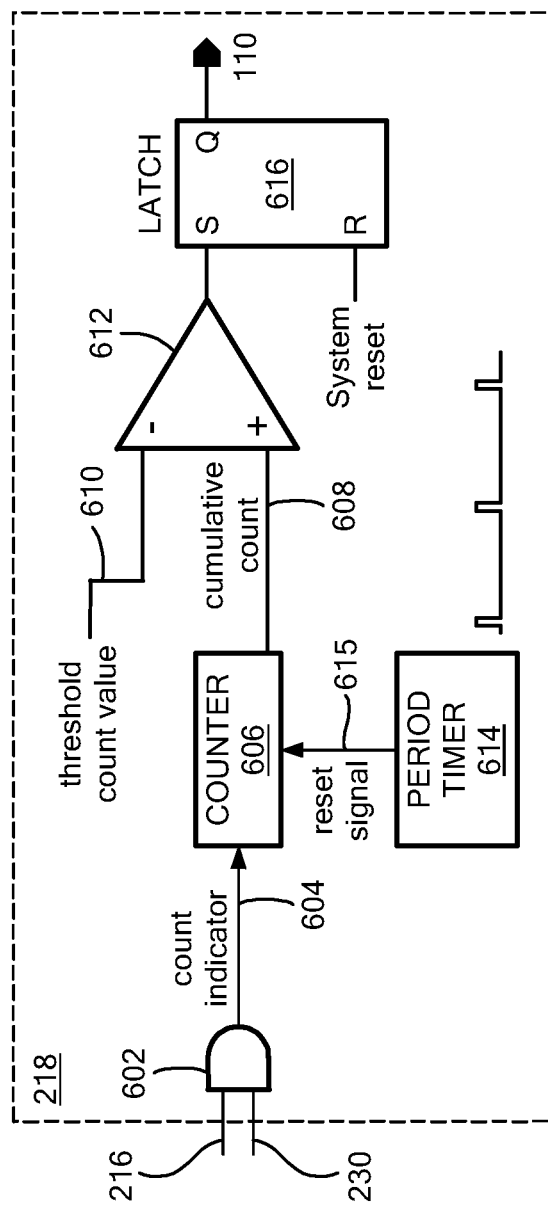
FIG. 6 shows an example digital processing block that can be included in the front end diagnostics block of FIG. 2.

FIG. 6 shows an example of the digital processing block 218 of FIG. 2. The digital processing block 218 includes digital circuitry that is configured to receive and process the offset fault signal 216 and the gain fault signal 230 to provide the error signal 110. In some implementations, the first and second front end elements 106a, 106b of FIG. 1 can be susceptible to signal noise, which can cause the fault signals 216, 230 (FIG. 2) to erroneously indicate a fault condition. The digital processing block 218 can implement filtering in order to eliminate or at least reduce the occurrence of erroneous fault signals. The digital filtering provided by the digital processing block 218 can require less silicon area than alternative filtering techniques, such as analog filtering techniques.

The digital processing block 218 can be configured to count instances of concurrent faults indicated by the offset fault signal 216 and the gain fault signal 230. In other words, when both the offset fault signal 216 and the gain fault signal 230 indicate respective faults at the same time, an instance of concurrent faults exists. The offset fault signal 216 and the gain fault signal 230 can be continuous in nature and sampled according to a clock (e.g., generated by a period timer 614). Thus, for each clock pulse that occurs while both the offset fault signal 216 and the gain fault signal 230 indicate respective faults, an instance of concurrent faults can be counted. The digital processing block 218 can be configured to compare a number of counted instances of concurrent faults over a particular time period to a threshold count value 610. The threshold count value 610 can represent an error duty cycle threshold. In some implementations, the threshold count value 610 may be a predetermined value that is set according to a safety standard. The threshold count value 610 can also be a user-selectable or programmable value. If the number of counted instances of concurrent faults over the particular time period satisfies the threshold count value 610, then the digital circuitry can indicate a system fault in the error signal 110.

In the illustrated example, the digital processing block 218 includes an AND gate 602 that is configured to receive the offset fault signal 216 and the gain fault signal 230 and provide a count indicator 604 that represents the offset fault signal 216 and the gain fault signal 230 concurrently indicating faults. For example, while the offset fault signal 216 and the gain fault signal 230 both indicate respective faults by concurrently having a value of "1", the count indicator 604 can likewise have a value of "1". The count indicator 604 is received by a counter 606 that is configured to output a cumulative count 608 that corresponds to the number of counted instances of concurrent faults over the particular time period. For example, for each clock pulse that occurs during which the count indicator 604 indicates concurrent faults by having a value of "1", the cumulative count 608 can be incremented. The digital circuitry includes a comparator 612 that is configured to compare the cumulative count 608 to the threshold count value 610. If the cumulative count 608 exceeds the threshold count value 610, then the comparator 612 is configured to output a signal indicative of the system fault. For example, the comparator 612 can output a value of "1" when the system fault is detected.

The digital processing block 218 can include a latch 616 that is configured to receive the signal indicative of the system fault from the comparator 612 and provide the error signal 110. For example, the latch 616 can provide the error signal 110 that indicates that a system fault is present. In some implementations, the error signal 110 can be provided as a digital signal having a value of "1" when the system fault is present. The error signal 110 can be provided to another portion of the sensor 102 and/or to an external component/system to indicate the system fault. The error signal 110 can cause the sensor 102 to latch, and the sensor 102 may be latched until a system reset signal is received by the latch 616.

The digital processing block 218 also includes a period timer 614 that is configured to provide the clock according to which the digital processing block 218 operates. The period timer 614 is also configured to provide a reset signal 615 for periodically resetting the counter 606. In some examples, the period timer 614 can provide the reset signal 615 after the particular time period has elapsed.

In some implementations, each of the offset comparator 214 and the gain comparator 228 may perform its own filtering such that the fault signals 216, 230 are pre-filtered before being received by the AND gate 602. The pre-filtering can be performed in a manner substantially similar to the filtering described above with respect to FIG. 6. In such implementations, the AND gate 602 can provide a signal to the latch 616 when concurrent faults are indicated by the fault signals 216, 230, and the latch 616 can in turn provide the error signal 110 indicating that a system fault is present to cause the sensor 102 to latch (i.e., without the additional filtering implemented by comparison to a threshold count value).

Figure 7:
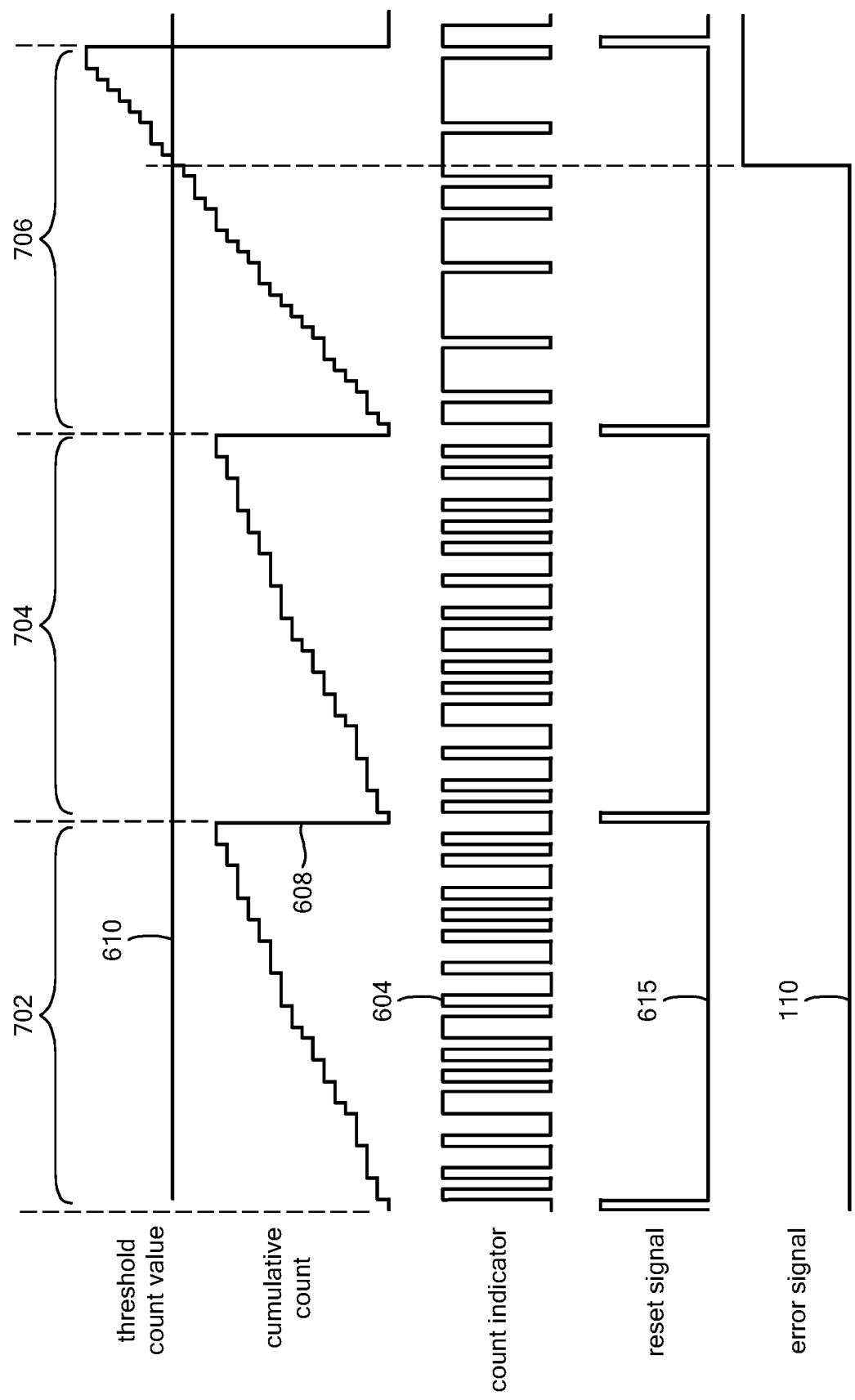
FIG. 7 shows waveforms illustrating operation of the digital processing block of FIG. 6.

FIG. 7 shows example waveforms associated with the digital processing block 218 of FIG. 6. The representation of the reset signal 615 indicates that the counter 606 is initially reset, which causes the cumulative count 608 to reset to zero. The counter 606 then receives a pulse on the count indicator 604 for each instance of the offset fault signal 216 and the gain fault signal 230 concurrently indicating respective faults. The counter 606 is configured to output the cumulative count 608, which indicates the number of counted instances of concurrent faults over the particular time period. The particular time period can be a periodic time period that is defined by the reset signal 615. For example, the particular time period can run from a time at which a first pulse on the reset signal 615 is received until a time at which a subsequent pulse on the reset signal 615 is received. During the particular time period, the counter 606 can continuously output the cumulative count 608. The cumulative count 608 is compared to the threshold count value 610, and if the cumulative count 608 exceeds the threshold count value 610 for the particular time period, then the error signal 110 indicating a system fault is provided.

In the illustrated example, during a first particular time period 702, the number of instances of concurrent faults as indicated by the cumulative count 608 does not exceed the threshold count value 610 before the next pulse on the reset signal 615 is received. Receipt of the pulse on the reset signal 615 causes the cumulative count 608 to reset to zero. During a second particular time period 704, the number of instances of concurrent faults as indicated by the cumulative count 608 again does not exceed the threshold count value 610 before the next pulse on the reset signal 615 is received. Receipt of the pulse on the reset signal 615 again causes the cumulative count 608 to reset to zero. During a third particular time period 706, referring to the count indicator 604, concurrent faults are indicated for a larger percentage of the time, as indicated by the relatively wider signal pulses as compared to those that occur during the first and second particular time periods 702, 704. This may be due to one or more errors being introduced to the sensor 102 (e.g., to one or both of the processing channels 122a, 122b) and/or to a system associated with the sensor 102. As a result, the number of instances of concurrent faults as indicated by the cumulative count 608 exceeds the threshold count value 610 before the next pulse on the reset signal 615 is received. In response to the cumulative count 608 exceeding the threshold count value 610, the error signal 110 indicates a system fault by a change of logic or signal level or state.

Having described preferred embodiments, it will now become apparent to one of ordinary skill in the art that other embodiments incorporating their concepts may be used. For example, while the sensor 102 has been described as being a magnetic field sensor in some implementations, it will be appreciated by those of ordinary skill in the art that the circuitry and methods described herein can be used on any type of integrated circuit or sensor or system requiring redundant sensing.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

It is felt therefore that these embodiments should not be limited to disclosed embodiments, but rather should be limited only by the spirit and scope of the appended claims.

What is claimed is:

1. A sensor comprising:
  a first sensing element configured to sense a parameter and generate a first sensing element output signal indicative of the parameter;
  a first front end element configured to receive the first sensing element output signal and to generate a first front end signal;
  a second sensing element configured to sense the parameter and generate a second sensing element output signal indicative of the parameter;
  a second front end element configured to receive the second sensing element output signal and to generate a second front end signal;
  a difference block configured to receive the first and second front end signals and generate a difference signal indicative of a difference between the first and second front end signals;
  an absolute value block configured to receive the difference signal and generate an absolute difference signal indicative of an absolute value of the difference signal; and
  an offset comparator configured to compare the absolute difference signal to an offset threshold to detect whether a difference between an offset associated with the first front end signal and an offset associated with the second front end signal is within a predetermined tolerance.

2. The sensor of claim 1, further comprising:
  a scaling block configured to receive the first and second front end signals and generate a scaled average signal indicative of an average of the first and second front end signals scaled by a gain threshold;
  a second absolute value block configured to receive the scaled average signal and generate an absolute scaled average signal indicative of an absolute value of the scaled average signal; and
  a gain comparator configured to compare the absolute scaled average signal to the absolute difference signal to detect whether a difference between a gain associated with the first front end signal and a gain associated with the second front end signal is within a second predetermined tolerance.

3. The sensor of claim 1, wherein the first front end element comprises a first amplifier and wherein the second front end element comprises a second amplifier.

4. The sensor of claim 1, wherein each of the first sensing element and the second sensing element comprises a magnetic field sensing element.

5. The sensor of claim 4, wherein the magnetic field sensing element comprises a Hall effect element.

6. The sensor of claim 2, wherein the offset comparator is configured to generate an offset fault signal indicative of whether the difference between the offset associated with the first front end signal and the offset associated with the second front end signal is within the predetermined tolerance.

7. The sensor of claim 6, wherein the gain comparator is configured to generate a gain fault signal indicative of whether the difference between the gain associated with the first front end signal and the gain associated with the second front end signal is within the second predetermined tolerance.

8. The sensor of claim 7, wherein the sensor is configured to identify a system fault based on one or both of the offset fault signal and the gain fault signal.

9. The sensor of claim 8, wherein the sensor is configured to identify a system fault when both the offset fault signal and the gain fault signal indicate respective faults.

10. The sensor of claim 1, wherein the first front end signal and the second front end signal are each differential voltage signals.

11. The sensor of claim 1, further comprising an offset threshold generator configured to generate the offset threshold.

12. The sensor of claim 2, wherein the absolute value block comprises a cross switch configured to invert a polarity of the difference signal if the difference signal is negative, and wherein the second absolute value block comprises a second cross switch configured to invert a polarity of the scaled average signal if the scaled average signal is negative.

13. The sensor of claim 12, wherein the absolute value block comprises a comparator configured to identify whether the difference signal is negative, and wherein the second absolute value block comprises a second comparator configured to identify whether the scaled average signal is negative.

14. The sensor of claim 1, wherein the difference block comprises a passive resistor network.

15. The sensor of claim 1, wherein the difference block comprises an operational amplifier.

16. The sensor of claim 2, wherein the gain threshold is determined based at least in part on a configurable resistive value.

17. The sensor of claim 2, wherein the gain threshold has a value less than one.

18. A sensor comprising:
a first sensing element configured to sense a parameter and generate a first sensing element output signal indicative of the parameter;
a first front end element configured to receive the first sensing element output signal and to generate a first front end signal;
a second sensing element configured to sense the parameter and generate a second sensing element output signal indicative of the parameter;
a second front end element configured to receive the second sensing element output signal and to generate a second front end signal;
an offset comparator configured to generate an offset fault signal indicative of whether a difference between an offset associated with the first front end signal and an offset associated with the second front end signal is within a predetermined tolerance;
a gain comparator configured to generate a gain fault signal indicative of whether a gain associated with the first front end signal and a gain associated with the second front end signal is within a second predetermined tolerance; and
digital circuitry configured to:
receive the offset fault signal and the gain fault signal;
count instances of concurrent faults indicated by the offset fault signal and the gain fault signal;
compare a number of counted instances of concurrent faults over a particular time period to a threshold count value; and
indicate a system fault if the number of counted instances of concurrent faults over the particular time period satisfies the threshold count value.

19. The sensor of claim 18, wherein the offset comparator is configured to compare an absolute difference signal indicative of an absolute value of a difference between the first front end signal and the second front end signal to an offset threshold.

20. The sensor of claim 19, wherein the gain comparator is configured to compare an absolute scaled average signal indicative of an absolute value of a scaled average signal indicative of an average of the first front end signal and the second front end signal scaled by a gain threshold to the absolute difference signal.

21. The sensor of claim 18, wherein the digital circuitry comprises:
an AND gate configured to receive the offset fault signal and the gain fault signal and provide a count indicator;
a counter configured to receive the count indicator and output a cumulative count that corresponds to the number of counted instances of concurrent faults over the particular time period; and
a comparator configured to:
compare the cumulative count to the threshold count value; and
output a signal indicative of the system fault if the cumulative count satisfies the threshold count value.

* * * * *